(12) United States Patent
Lipka

(10) Patent No.: US 6,202,074 B1
(45) Date of Patent: Mar. 13, 2001

(54) MULTIPLIERLESS DIGITAL FILTERING

(75) Inventor: Dietmar Lipka, Berg (DE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/131,336

(22) Filed: Aug. 7, 1998

(51) Int. Cl.[7] .................................................. G06F 17/10
(52) U.S. Cl. .......................................... 708/307; 708/313
(58) Field of Search ...................................... 708/307, 313

(56) References Cited

U.S. PATENT DOCUMENTS

| | | | |
|---|---|---|---|
| 3,814,917 | * 6/1974 | Nussbaumer | 708/307 |
| 3,822,404 | * 7/1974 | Croisier et al. | 708/307 |
| 5,528,527 | * 6/1996 | Iwata et al. | 708/313 |
| 5,596,609 | * 1/1997 | Genrich et al. | 708/313 |
| 5,838,725 | * 11/1998 | Gurusami et al. | 708/313 |

OTHER PUBLICATIONS

"FIR Filter for Processing Sigma–Delta Modulator Outputs," IBM Technical Disclosure Bulletin, vol. 33, No. 6B, Nov. 1990, pp. 168–171, XP000108833.

N. Kouvaras, et al., "Realisation of Nonrecursive Delta-Modulation Filters using Look-up Tables," I.E.E. Proceedings–G/Electronic Circuits and Systems, vol. 134, No. 3, Jun. 1987, pp. 127–131, XP002092360.

Shengping Yang, et al., "A Tunable Bandpass Sigma–Delta A/D Conversion for Mobile Communication Receiver," IEEE Vehicular Technology Conference, vol. 2, 1994, pp. 1346–1350.

Richard Schreier, "An Empirical Study of High–Order Single–Bit Delta–Sigma Modulators," IEEE Transactions on Circuits and Systems—II: Analog and Digital Signal Processing, vol. 40, No. 8, Aug. 1993, pp. 461–466.

* cited by examiner

*Primary Examiner*—David H. Malzahn
(74) *Attorney, Agent, or Firm*—Burns, Doane, Swecker & Mathis, L.L.P.

(57) ABSTRACT

Digital filtering is performed by receiving an L-bit block of 1-bit data samples, wherein L is greater than 1, and using the L-bit block of 1-bit data samples to select a corresponding one of $2^L$ filter output values. Selection may be accomplished by using each of the L 1-bit data samples to determine a product value by alternatively selecting a corresponding filter coefficient or a negation of the filter coefficient, and then generating the corresponding one of the $2^L$ filter output values by adding together the L product values. Alternatively, part or all of the L-bit block of 1-bit data samples may be used to address one or more memory structures having stored therein corresponding filter output values. When more than one memory structure is used, the outputs from the memories are added together to generate the filter result. In another aspect, a shift register and latch arrangement decimate the serially received 1-bit data samples, thereby allowing the filter result to be generated at the decimated rate.

24 Claims, 5 Drawing Sheets

MULTIPLIERLESS DIGITAL FILTERING

BACKGROUND

The present invention relates to digital filtering techniques, and more particularly, to filtering techniques that avoid the use of multipliers.

In state of the art applications requiring decimation of a high-rate digital signal, such as a 1-bit signal generated by a sigma-delta modulator, cascade-integrate-comb filters (CIC-filters) are used for a first decimation stage. These are then followed by a conventional finite impulse response (FIR) decimation filter stage. Decimation by N means that the filter output sample will be generated only once for every N data samples. Each filter output is a multi-bit value that is representative of the corresponding N data samples.

FIG. 1 is a block diagram of an exemplary prior art implementation of a three-stage CIC-filter that decimates the input signal by a factor of N. As can be seen from the figure, the CIC-filter consists of a number of accumulators 11 as a first stage, which is operated at the rate of a fast sampling clock 15. The following decimation stage 13 then generates samples at the rate of a lower decimated clock 17 by supplying only every Nth sample at its output and leaving out the others. Finally, a third stage contains differentiators 19 operated at the decimated clock rate.

As all filter coefficients are set to 1, CIC-filters do not need multipliers. As a result, they can run at speeds limited by the speed of the adders (in the first stage). Thus, when very high data rates are involved, CIC-filters are used for the first decimation steps in order to lower the data rate sufficiently to enable FIR filters to be used. However, the sin(x)/x frequency domain characteristic of the CIC-filters must be compensated for by the subsequent FIR filters, which complicates the design of these FIR filters. For very fast applications, the adders in the CIC-filter are the speed limiting factor.

Also, the structure illustrated in FIG. 1 is rather inflexible so that filter banks may be required if fast variability of the filter characteristic (and thus varying number of stages) is required. That further complicates the filter structure.

SUMMARY

It is therefore an object of the present invention to provide improved digital filtering techniques.

In accordance with one aspect of the present invention, the foregoing and other objects are achieved in filtering apparatuses and methods that include receiving an L-bit block of 1-bit data samples, wherein L is greater than 1; and using the L-bit block of 1-bit data samples to select a corresponding one of $2^L$ filter output values.

In accordance with another aspect of the invention, using the L-bit block of 1-bit data samples to select a corresponding one of $2^L$ filter output values comprises using each of the L 1-bit data samples to determine a product value by alternatively selecting a corresponding filter coefficient or a negation of the filter coefficient; and generating the corresponding one of the $2^L$ filter output values by adding together the L product values.

In yet another aspect of the invention, using the L-bit block of 1-bit data samples to select a corresponding one of $2^L$ filter output values may alternatively comprise using the L-bit block of 1-bit data samples to address an addressable memory having stored therein the $2^L$ filter output values, wherein each L-bit block of 1-bit data samples addresses a corresponding one of the $2^L$ filter output values, thereby causing the addressed filter output value to be supplied at an output of the addressable memory. The $2^L$ filter output values may represent $2^L$ possible sums of L values, each value alternatively representing one of L filter coefficients or a negation of the one of L filter coefficients. Alternatively, each value may alternatively represent one of L filter coefficients or zero.

In other aspects of the invention, the single addressable memory can be replaced by several smaller memories, each receiving, as an address, a corresponding subset of bits from the L-bit block of 1-bit data samples. The outputs of the smaller memories are combined to generate the filter output value.

In still another aspect of the invention, using the L-bit block of 1-bit data samples to select a corresponding one of $2^L$ filter output values may comprise using a group of m(i) bits of the L-bit block of 1-bit data samples to address a corresponding one of a number, K, of addressable memories, wherein $1 \leq i \leq K$, and wherein each addressable memory has stored therein $2^{m(i)}$ partial filter output values, wherein each group of m(i) bits addresses a corresponding one of $2^{m(i)}$ partial filter output values, thereby causing an addressed partial filter output value to be supplied at an output of the addressable memory. The corresponding one of the $2^L$ filter output values are then generated by combining the partial filter output values from the K addressable memories. In some embodiments, m(i)=L/K for $1 \leq i \leq K$. That is, each of the K memories may receive the same number, L/K, of bits from the L-bit block of 1-bit data samples.

In yet another aspect of the invention, one or more N-bit blocks of 1-bit data samples are latched in a cascaded latch arrangement, wherein each of the latching steps is performed in response to a decimated clock signal that is asserted once for every N assertions of a sampling clock rate. Latched values from each of the one or more cascaded latches are grouped together so as to form at least part of the L-bit block of 1-bit data samples that are received.

In still another aspect of the invention, an additional latch is provided that receives and latches one or more 1-bit data samples from an output of a last one of the one or more cascaded latch arrangement, wherein the additional latch operates in response to the decimated clock signal. A latched value from the additional latch is used to form at least part of the L-bit block of 1-bit data samples that are received. The additional latch is useful when L is not an integer multiple of N.

In yet another aspect of the invention, the 1-bit data samples are serially received under the control of a sampling clock. An N-bit block of the serially received 1-bit samples are then supplied for use in a first one of the cascaded latches.

BRIEF DESCRIPTION OF THE DRAWINGS

The objects and advantages of the invention will be understood by reading the following detailed description in conjunction with the drawings in which.

DETAILED DESCRIPTION

Figure 1:
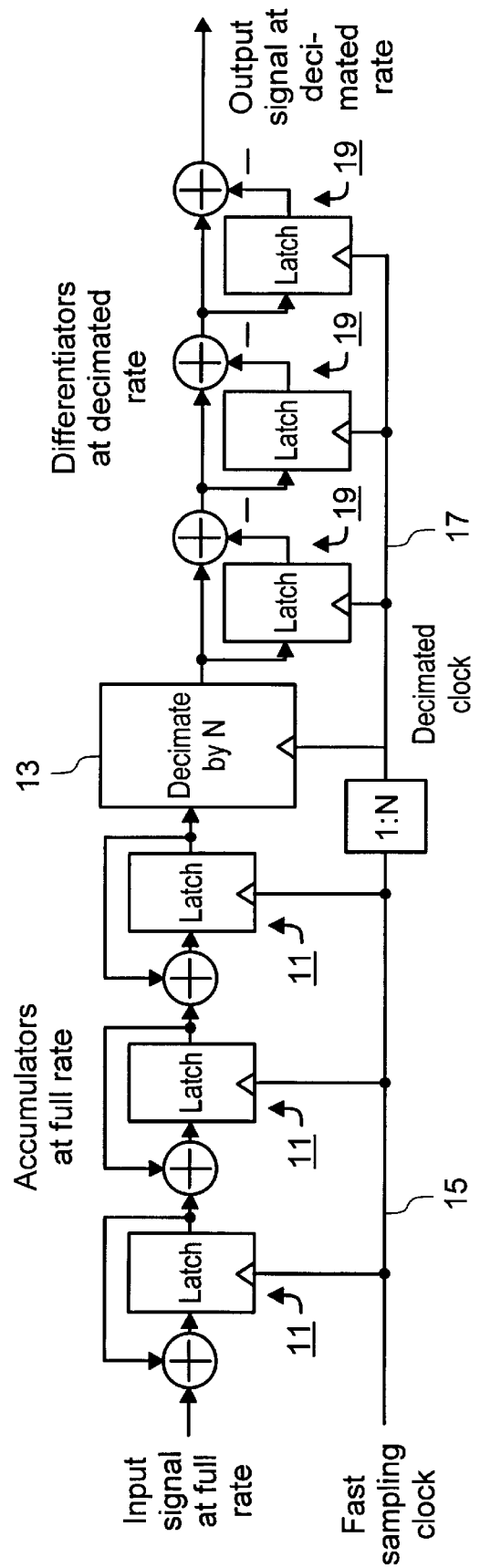
FIG. 1 is a block diagram of an exemplary prior art implementation of a three-stage CIC-filter.

The various features of the invention will now be described with respect to the figures, in which like parts are identified with the same reference characters.

Figure 2:
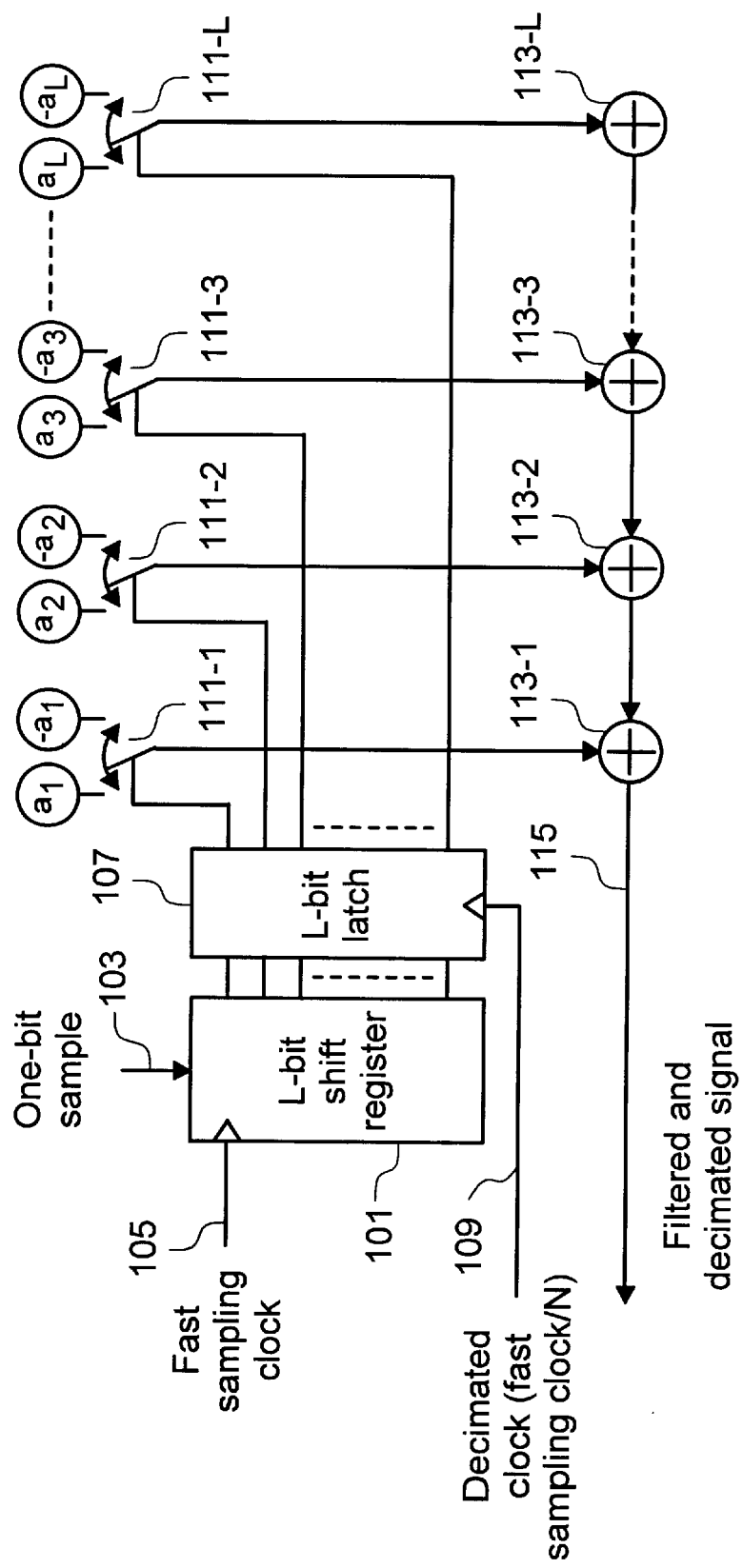
FIG. 2 is a block diagram of an exemplary multiplierless decimation filter of order L, in accordance with one aspect of the invention.

FIG. 2 is a block diagram of an exemplary multiplierless decimation filter of order L, in accordance with one aspect of the invention. An L-bit shift register 101 receives the 1-bit input data 103 at a data input port. The L-bit shift register 101 is clocked with a fast sampling clock 105 that is asserted once for each input data value. An L-bit latch 107 has a data input port coupled to receive an L-bit output from the L-bit shift register 101. The L-bit latch 107 is clocked by a decimated clock 109 that is asserted once for every N cycles of the fast sampling clock 105. Consequently, each time a number of N 1-bit input data samples has been (sequentially) loaded into the L-bit shift register 101, a block of L data samples is clocked into the latch 107.

Each of the L values supplied at the output of the L-bit latch 107 needs to be multiplied by a corresponding one of L coefficients, identified as $a_x$, 1<x<L. Assuming that each latched data value represents either the value "1" or "1", each product will either be the coefficient, $a_x$, or the negated coefficient, $-a_x$. Thus, in accordance with another aspect of the invention, each of these possibilities is provided to one input of a switch 111-1 . . . 111-L. Each bit supplied at the output of the L-bit latch 107 controls the switching operation of a corresponding one of the switches 111-1 . . . 111-L, so that the appropriate product will be supplied at the output of the switch 111-1 . . . 111-L. That is, the multiplication required by the filtering operation is made by using the signal bits to select either the positive or negative value of the corresponding coefficient. The outputs from the switches 111-1 . . . 111-L are then supplied to adding means, such as the illustrated plurality of adders 113-1 . . . 113-L, in order to produce the filtered and decimated signal 115. With this arrangement, the multiplication and addition operations are performed while the next N-wide block of 1-bit input samples is read. That is, the filter operations (multiplications with coefficients and subsequent addition) are done at the decimated rate, providing for much higher-speed operation than conventional CIC-filters, whose adders must operate at the fast sampling clock rate.

Figure 3:
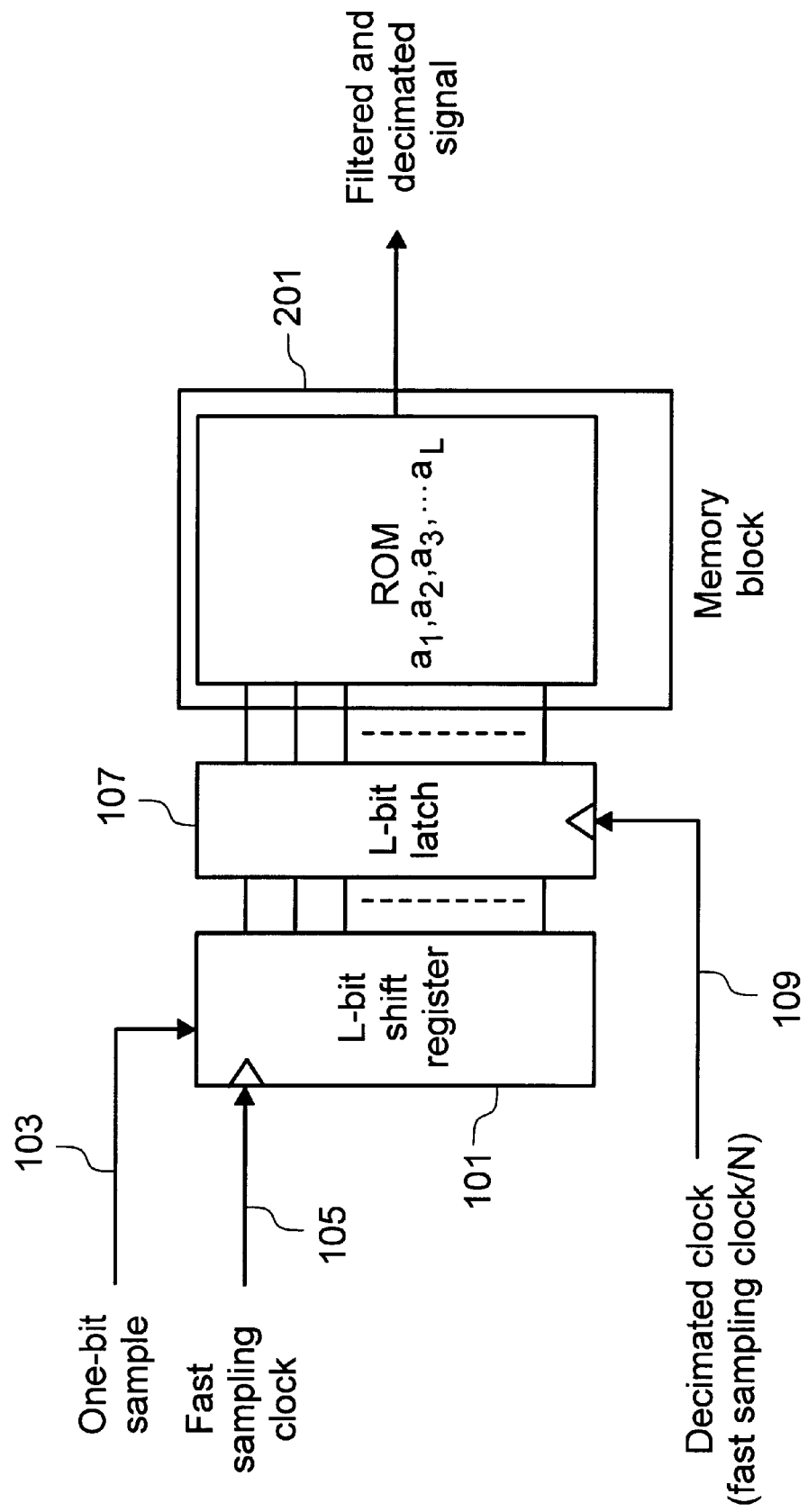
FIG. 3 is a block diagram of an alternative embodiment of a multiplierless decimation filter, in accordance with another aspect of the invention.

In another aspect of the invention, the filter can be further simplified as illustrated in the block diagram of FIG. 3. Operation of this embodiment is based on the mathematical formulation of the filter output signal, y, namely, $y = \pm a_1 \pm a_2 \pm a_3 \ldots \pm a_L$. Each sign of the coefficients is selected by the corresponding 1-bit value of the sample signal 103. The total number of combinations of the signed filter coefficients, and thus y-values, is $2^L$. This leads to a new structure that does not require the dynamic performance of any arithmetic operation. In place of the switches 111-1 . . . 111-L and adders 113-1 . . . 113-L, an addressable memory 201 is provided, having stored therein all possible $2^L$ filter coefficient combinations at addresses corresponding to each of the possible L-bit sample groups provided at the output of the L-bit latch 107. The L-bit long signal block from the L-bit latch 107 is supplied to the address input of the memory 201, so that it will select the corresponding pre-stored output value y.

Figure 4:
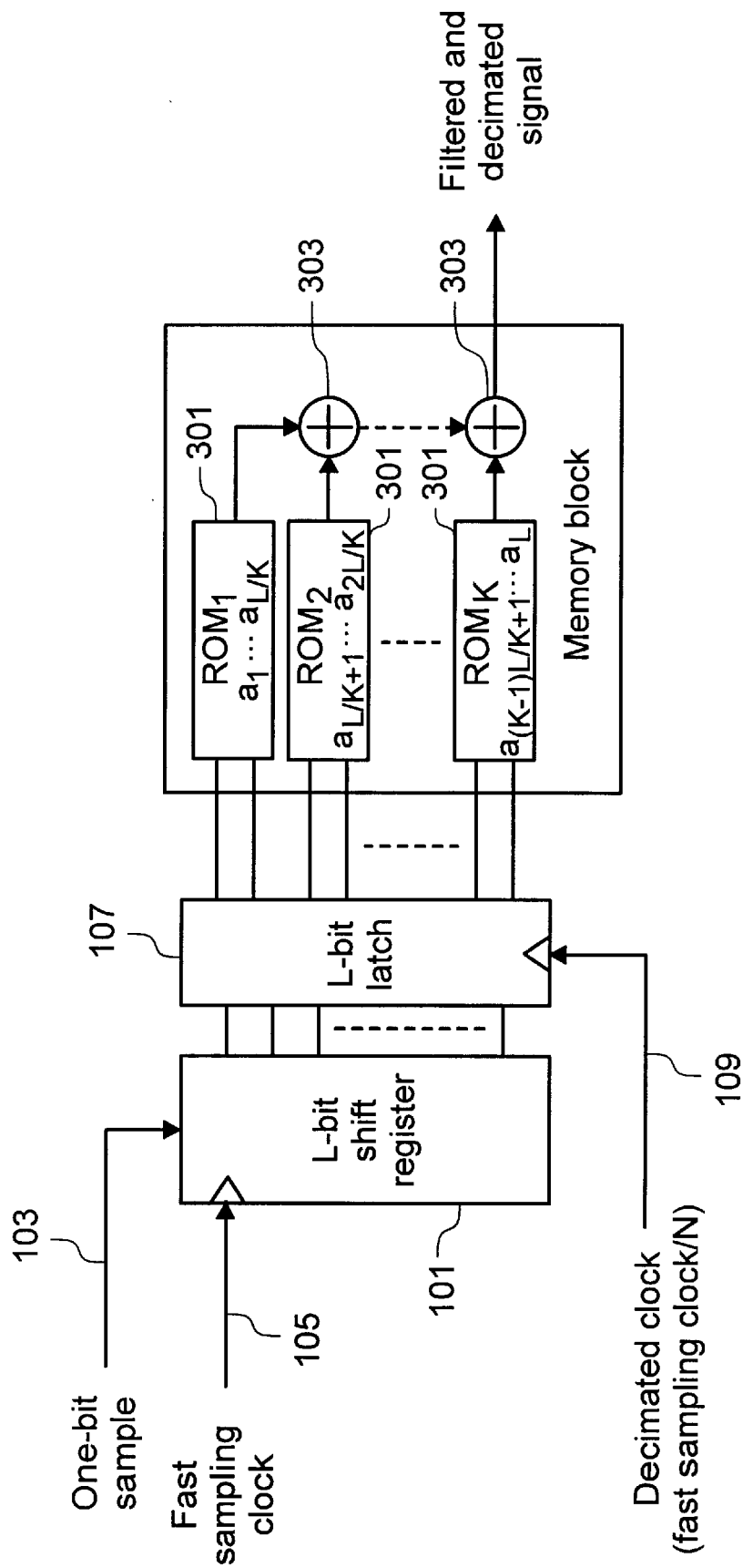
FIG. 4 is a block diagram of yet another embodiment of the multiplierless decimation filter, in accordance with yet another aspect of the invention.

As the number of bits, L, stored in the L-bit latch 107 gets larger and larger, the size of the memory 201 may grow to be larger than is practical in some embodiments. Thus, in another aspect of the invention illustrated in FIG. 4, an alternative embodiment is provided in which a number of smaller addressable memories 301 take the place of the one larger memory 201. In this embodiment, the L data samples supplied at the output of the L-bit latch 107 are subdivided into K blocks. If K is a divisor or L, each block addresses one of the memories 301 that stores $2^{L/K}$ coefficient combinations. Adding means, such as the plurality of adders 303, combine the outputs from the plurality of memories 301. The total memory size reduces thus to $K \times 2^{L/K}$ at the expense of requiring more adders working at the decimated clock frequency. This distributed structure is thus an intermediate solution of those described above and illustrated in FIGS. 2 and 3. Although the embodiment depicted in FIG. 4 shows the number of bits, L/K, supplied to each of the memories 301 being the same for all memories 301, this need not be the case. That is, in alternative embodiments, there need not be a relationship between the number, K, of memories 301 and the number of bits supplied to any one memory. In these alternative embodiments, different numbers of bits may be supplied to different ones of the memories 301, so long as the size of any given memory 301 is large enough to provide a complete address space as defined by the number of address bits supplied to it. For example, if L=8, it is possible to construct the filter with two memories 301, a first receiving 2 of the bits from the L-bit latch 107, and a second receiving the remaining 6 bits from the L-bit latch 107. In this example, the first memory 301 would have to have at least $2^2$ addressable storage locations, while the second memory 301 would have to have at least $2^6$ addressable storage locations.

For filters with orders L>N, the L-bit shift register can be reduced to an implementation utilizing no higher than N-bit shift registers. This is advantageous in practical implementations because this register runs at the highest speed (i.e., at the fast sampling clock rate), and the number of high-speed components should be reduced as much as possible. As shown in the exemplary embodiment depicted in FIG. 5, the one L-bit latch 107 is replaced by a plurality of cascade-connected N-bit latches as required to store the L most recent values of the 1-bit sample 103 (N<L). Each latch 401 is clocked by the decimated clock, and each (with the exception of the first latch 401) receives the N-bit output from a predecessor latch 401 in the cascade. The first latch 401 in the cascade receives the N-bit output from the N-bit shift register 101.

The output from each latch 401 is further supplied to a corresponding portion of the address port of a memory block 403. The memory block 403 has stored therein each of the possible coefficient combinations in correspondence with the $2^L$ possible input address values that can be supplied by the latches 401. Although the memory block 403 is depicted as a single memory (such as the one shown in FIG. 3), it may alternatively be embodied as a plurality of memories arranged as shown in FIG. 4, or in still other alternatives, may have a structure as illustrated in FIG. 2 (i.e., a plurality of circuits, each alternatively supplying a coefficient or its negation at an output, under the control of a single one-bit sample value).

Figure 5:
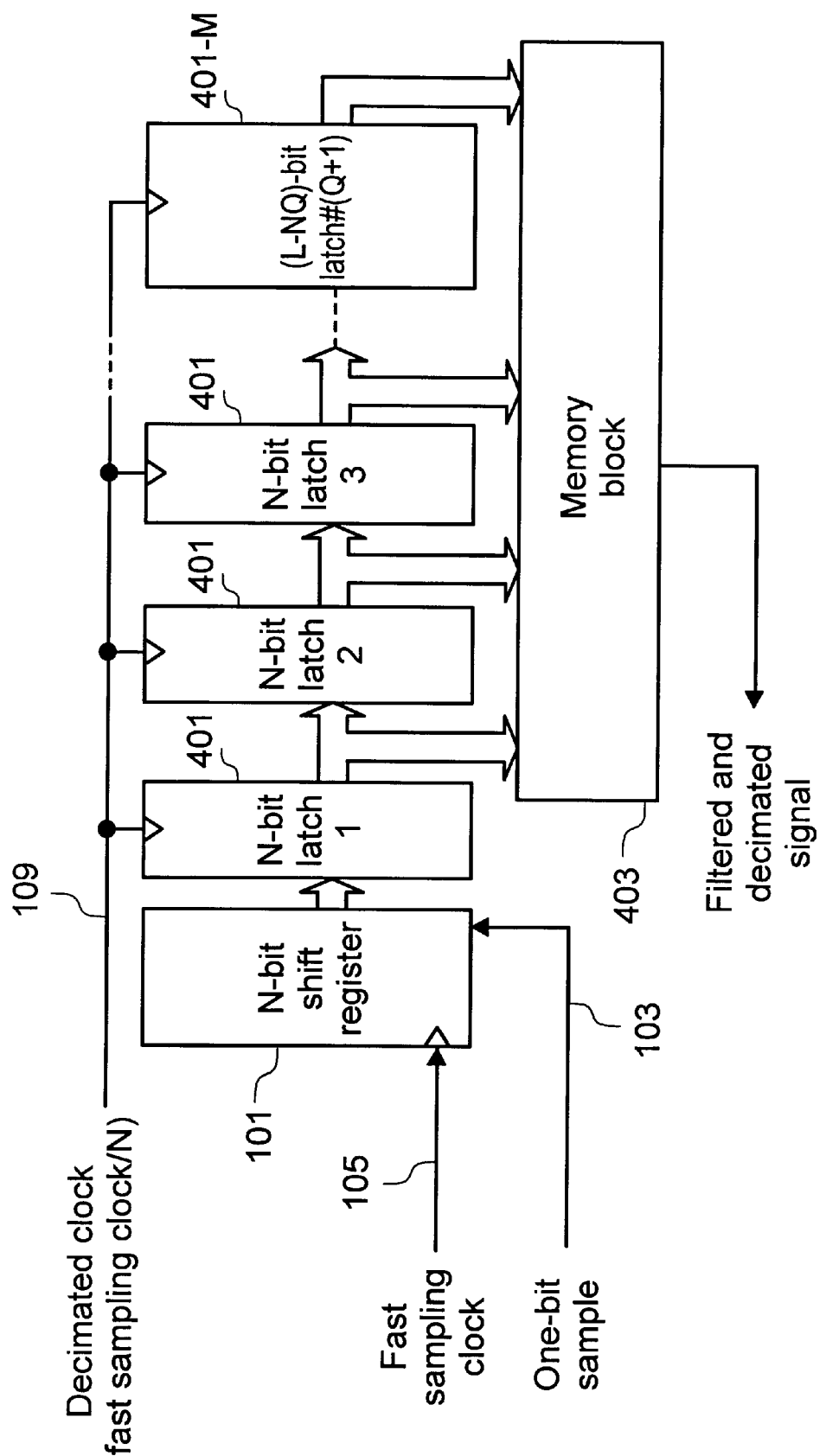
FIG. 5 is a block diagram of still another embodiment of the multiplierless decimation filter that uses cascaded filtering structures, in accordance with still another aspect of the invention.

In the structure shown in FIG. 5, the N-bit wide blocks are shifted from one latched stage to the next with each assertion of the decimated clock 109. Each time the contents of an N-bit latch 401 changes, the newly latched data block is supplied as a part of the address into the memory block 403. In combination, the contents of all the latches 401 select another value from the memory block 403. The value supplied at the output of the memory block constitutes the filtered signal. The filter order is L and M the number of stages in the cascade. L need not be an integer multiple of N, so that the last latch 401-M can be smaller than the other ones. In such a situation, the size of the last latch 401-M should be reduced accordingly, so that its output will not attempt to access an address space larger than the memory block 403 is capable of storing. In particular, let L=Q·N+R, where Q is an integer, and R<N. When L is an integer multiple of N, then R=0, and the total number, M, of required latches will be Q, each one being an N-bit latch 401. In this case, the last latch 401-M depicted in FIG. 5 is not used.

When L is not an integer multiple of N, however, R is a non-zero remainder value determined by R=(L−Q·N). The total number, M, of latches needed in this case will be Q+1. Of these, Q of them will be N-bit latches 401, and the last latch 401-M (i.e., latch number Q+1) should have a size equal to R.

The exemplary filter structures disclosed herein are multiplierless and perform arithmetic adder operations at the decimated clock rate. Therefore they are much faster than CIC-filters used in state of the art applications. Moreover, because the filter techniques disclosed herein apply general FIR-filtering, it is not necessary to accept special filter characteristics, such as the sin(x)/x frequency domain shape of a conventional CIC-filter. Instead, the filter can directly be designed for the best characteristic. Speed enhancement as well as power reduction are accomplished, in part, by the substitution of a passive memory read operation for the active multiplication operations normally associated with digital filtering. The delay through the filter is also very low because the input rate is high.

The inventive filtering techniques disclosed here also offer the advantage of versatility, since different filter characteristics can simply be stored in a memory and selected with additional address bits. Such an arrangement would permit instantaneous switching of the filter characteristic.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A digital decimation filter having L coefficients, comprising:
    a shift register for serially receiving 1-bit data samples under the control of a sampling clock:
    a latch, coupled to receive a block of the 1-bit data samples from a parallel output of the shift register, and for supplying an L-bit block of the 1-bit data samples to selecting means, wherein the latch performs a latching operation under the control of a decimated clock that is asserted once for every N assertions of the sampling clock, wherein N denotes a decimation factor; and
    the selecting means for using the L-bit block of 1-bit data samples to select a corresponding one of $2^L$ filter output values.

2. The digital decimation filter of claim 1, wherein the selecting means comprises:
    a number, L, of switches, each for selectively outputting a filter coefficient or a negation of the filter coefficient, wherein selection is controlled by a corresponding one of the 1-bit data samples in the L-bit block; and
    means for generating the corresponding one of the $2^L$ filter output values by adding together the outputs of the L switches.

3. The digital decimation filter of claim 1, wherein the selecting means comprises:
    an addressable memory having an address port coupled to receive the L-bit block of 1-bit data samples, and having stored therein the $2^L$ filter output values, wherein each L-bit block of 1-bit data samples addresses a corresponding one of the $2^L$ filter output values, thereby causing the addressed filter output value to be supplied at an output of the addressable memory.

4. The digital decimation filter of claim 3, wherein the $2^L$ filter output values represent $2^L$ possible sums of L values, each value alternatively representing one of L filter coefficients or a negation of the one of L filter coefficients.

5. The digital decimation filter of claim 3, wherein the $2^L$ filter output values represent $2^L$ possible sums of L values, each value alternatively representing one of L filter coefficients or zero.

6. The digital decimation filter of claim 1, wherein the selecting means comprises:
    a number, K, of addressable memories, each having an address port coupled to receive a corresponding group of m(i) bits of the L-bit block of 1-bit data samples, wherein $1 \leq i \leq K$, and each having stored therein $2^{m(i)}$ partial filter output values, wherein each group of m(i) bits addresses a corresponding one of $2^{m(i)}$ partial filter output values, thereby causing an addressed partial filter output value to be supplied at an output of the addressable memory; and
    means for generating the corresponding one of the $2^L$ filter output values by adding together the partial filter output values from the K addressable memories.

7. The digital decimation filter of claim 6, wherein m(i)=L/K for $1 \leq i \leq K$.

8. The digital decimation filter of claim 1, wherein:
    the shift register is an L-bit shift register; and
    the latch is an L-bit latch.

9. The digital decimation filter of claim 1, further comprising one or more cascade-connected N-bit latches, each for storing an N-bit block of the 1-bit data samples, wherein each of the N-bit latches performs a latching operation in response to the decimated clock, and
    wherein outputs from each of the one or more cascade-connected N-bit latches are grouped together to form at least part of the L-bit block of 1-bit data samples.

10. The digital decimation filter of claim 9, further comprising an additional latch, coupled to receive and latch one or more 1-bit samples from an output of a last one of the one or more cascade-connected N-bit latches, wherein the additional latch performs a latching operation in response to the decimated clock, and
    wherein an output from the additional latch forms at least part of the L-bit block of 1-bit data samples.

11. The digital decimation filter of claim 9, wherein the shift register is an N-bit shift register for supplying an N-bit block of 1-bit samples to the latch.

12. The digital decimation filter of claim 1, further comprising an additional latch, coupled to receive and latch one or more 1-bit data samples from an output of the latch, wherein the additional latch performs a latching operation in response to the decimated clock, and wherein an output from the additional latch forms at least part of the L-bit block of 1-bit data samples.

13. A digital decimation filtering method, comprising the steps of:

serially receiving 1-bit data samples under the control of a sampling clock;

latching a parallel-supplied block of the 1-bit data samples, wherein the latching is performed under the control of a decimated clock that is asserted once for every N assertions of the sampling clock, wherein N denotes a decimation factor; and using an L-bit block of the latched 1-bit data samples to select a corresponding one of $2^L$ filter output values.

14. The method of claim 13, wherein the step of using the L-bit block of the latched 1-bit data samples to select a corresponding one of $2^L$ filter output values comprises the steps of:

using each of the 1-bit data samples in the L-bit block to determine a product value by alternatively selecting a corresponding filter coefficient or a negation of the filter coefficient; and generating the corresponding one of the $2^L$ filter output values by adding together the L product values.

15. The method of claim 13, wherein the step of using the L-bit block of the latched 1-bit data samples to select a corresponding one of $2^L$ filter output values comprises the steps of:

using the L-bit block of the latched 1-bit data samples to address an addressable memory having stored therein the $2^L$ filter output values, wherein each L-bit block of 1-bit data samples addresses a corresponding one of the $2^L$ filter output values, thereby causing the addressed filter output value to be supplied at an output of the addressable memory.

16. The method of claim 15, wherein the $2^L$ filter output values represent $2^L$ possible sums of L values, each value alternatively representing one of L filter coefficients or a negation of the one of L filter coefficients.

17. The method of claim 15, wherein the $2^L$ filter output values represent $2^L$ possible sums of L values, each value alternatively representing one of L filter coefficients or zero.

18. The method of claim 13, wherein the step of using the L-bit block of the latched 1-bit data samples to select a corresponding one of $2^L$ filter output values comprises:

using a group of m(i) bits of the L-bit block of 1-bit data samples to address a corresponding one of a number, K, of addressable memories, wherein $1 \leq i \leq K$, and wherein each addressable memory has stored therein $2^{m(i)}$ partial filter output values, wherein each group of m(i) bits addresses a corresponding one of $2^{m(i)}$ partial filter output values, thereby causing an addressed partial filter output value to be supplied at an output of the addressable memory; and generating the corresponding one of the $2^L$ filter output values by adding together the partial filter output values from the K addressable memories.

19. The method of claim 18, wherein m(i)=L/K for $1 \leq i \leq K$.

20. The method of claim 13, wherein:

the step of serially receiving the 1-bit data samples under the control of the sampling clock comprises clocking the 1-bit data samples into an L-bit shift register; and the step of latching the parallel-supplied block of the 1-bit data samples comprises clocking a parallel-supplied block of the 1-bit data samples from an output of the L-bit shift register into an L-bit latch under the control of the decimated clock.

21. The method of claim 13, further comprising one or more cascaded N-bit latching steps, each N-bit latching step including the step of storing an N-bit block of the 1-bit data samples, wherein each of the N-bit latching steps is performed in response to the decimated clock; and grouping together N-bit latched values from each of the one or more cascaded N-bit latching steps so as to form at least part of the L-bit block of 1-bit data samples.

22. The method of claim 21, further comprising an additional latching step that includes the steps of receiving and latching one or more 1-bit data samples from an output of a last one of the one or more cascaded N-bit latching steps, wherein the additional latching step is performed in response to the decimated clock, and using a latched value from the additional latching step to form at least part of the L-bit block of 1-bit data samples.

23. The method of claim 21, wherein the step of serially receiving the 1-bit data samples under the control of the sampling clock comprises:

serially receiving the 1-bit data samples in an N-bit shift register under the control of the sampling clock, and supplying an N-bit block of 1-bit samples from the N-bit shift register for use in the step of latching the parallel-supplied block of the 1-bit data samples.

24. The method of claim 13, further comprising an additional latching step that includes the steps of receiving and latching one or more 1-bit data samples from an output of the step of latching the parallel-supplied block of the 1-bit data samples, wherein the additional latching step is performed in response to the decimated clock, and using a latched value from the additional latching step to form at least part of the L-bit block of 1-bit data samples.

* * * * *